(12) United States Patent
Kim et al.

(10) Patent No.: US 10,395,088 B2
(45) Date of Patent: Aug. 27, 2019

(54) FAN-OUT FINGERPRINT SENSOR PACKAGE

(71) Applicant: SAMSUNG ELECTRONICS CO., LTD., Suwon-si (KR)

(72) Inventors: Min Keun Kim, Suwon-si (KR); Young Sik Hur, Suwon-si (KR); Yong Ho Baek, Suwon-si (KR); Tae Hee Han, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/922,348

(22) Filed: Mar. 15, 2018

(65) Prior Publication Data

US 2018/0307890 A1    Oct. 25, 2018

(30) Foreign Application Priority Data

Apr. 20, 2017 (KR) .................. 10-2017-0050802
Aug. 22, 2017 (KR) .................. 10-2017-0105906

(51) Int. Cl.
| H05K 5/00 | (2006.01) |
| H05K 7/00 | (2006.01) |
| H05K 1/18 | (2006.01) |
| G06K 9/00 | (2006.01) |
| H01L 23/498 | (2006.01) |
| H01L 23/31 | (2006.01) |

(52) U.S. Cl.
CPC ...... *G06K 9/00053* (2013.01); *H01L 23/3121* (2013.01); *H01L 23/3128* (2013.01); *H01L 23/49816* (2013.01); *H01L 2224/73204* (2013.01); *H05K 1/185* (2013.01); *H05K 2201/10* (2013.01); *H05K 2201/10151* (2013.01)

(58) Field of Classification Search
CPC ............... H05K 1/185; H05K 2201/10; H05K 2201/10151
USPC ......................................... 361/760–764, 783
See application file for complete search history.

(56) References Cited

U.S. PATENT DOCUMENTS

| 8,717,775 B1 * | 5/2014 | Bolognia et al. .. G06K 9/00053 |
| | | 361/803 |
| 9,406,580 B2 | 8/2016 | Erhart et al. |
| 2012/0256280 A1 * | 10/2012 | Erhart et al. .......... H01L 21/561 |
| | | 257/414 |

(Continued)

*Primary Examiner* — Binh B Tran
(74) *Attorney, Agent, or Firm* — Sughrue Mion, PLLC

(57) ABSTRACT

A fan-out fingerprint sensor package includes a first connection member having a through-hole, a fingerprint sensor disposed in the through-hole, an encapsulant encapsulating at least portions of the first connection member and the fingerprint sensor, and a second connection member disposed on the first connection member and an active surface of the fingerprint sensor. The first connection member includes a distribution layer. The second connection member includes a first insulating layer disposed on the distribution layer and the active surface, a redistribution layer disposed on the first insulating layer, a first via connecting the redistribution layer to a connection pad of the fingerprint sensor, and a second via connecting the redistribution layer to the distribution layer. The first via passes through the first insulating layer and at least a portion of the encapsulant, and the second via passes through the first insulating layer.

16 Claims, 9 Drawing Sheets

(56) References Cited

U.S. PATENT DOCUMENTS

2016/0099210 A1\* 4/2016 Kwon et al. ...... H01L 21/76829
                                              257/774
2016/0365379 A1\* 12/2016 Kim et al. ........ H01L 27/14618
2017/0140202 A1   5/2017 Huang et al.

\* cited by examiner

FAN-OUT FINGERPRINT SENSOR PACKAGE

CROSS-REFERENCE TO RELATED APPLICATION

This application claims the benefit of priority to Korean Patent Application Nos. 10-2017-0050802 filed on Apr. 20, 2017 and 10-2017-0105906 filed on Aug. 22, 2017 with the Korean Intellectual Property Office, the entirety of which are incorporated herein by references.

BACKGROUND

The present disclosure relates to a fan-out fingerprint sensor package having a fingerprint recognition function.

The adoption of fingerprint sensors in smartphones is becoming common, and sizes of front displays are on the increase. To this end, various types of fingerprint sensor devices have been developed, for example, a fingerprint sensor device in which a fingerprint sensor is mounted on a ball grid array (BGA) substrate and connected by wire bonding, or a fingerprint sensor device in which a fingerprint sensor is mounted on a lower portion of a BGA substrate in flip-chip form.

SUMMARY

An aspect of the present disclosure provides a novel fingerprint recognition device in the form of a fan-out package, in which sensing sensitivity is improved by significantly reducing a sensing distance while a thickness and warpage are easily controlled, and which may be easily applied to an under display.

According to an aspect of the present disclosure, a fingerprint sensor is packaged in a fan-out panel level package, while novel via processing and redistribution layer design are introduced.

For example, a fan-out fingerprint sensor package includes a first connection member having a through-hole, a fingerprint sensor disposed in the through-hole of the first connection member, and having an active surface on which a connection pad and a sensing pattern are disposed and an inactive surface opposing the active surface, an encapsulant encapsulating at least portions of the first connection member and the fingerprint sensor, and a second connection member disposed on the first connection member and the active surface of the fingerprint sensor. The first connection member includes a distribution layer. The second connection member includes a first insulating layer disposed on the distribution layer of the first connection member and the active surface of the fingerprint sensor, a redistribution layer disposed on the first insulating layer, a first via connecting the redistribution layer to the connection pad of the fingerprint sensor, and a second via connecting the redistribution layer to the distribution layer of the first connection member. The first via passes through the first insulating layer and at least a portion of the encapsulant, and the second via passes through the first insulating layer.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
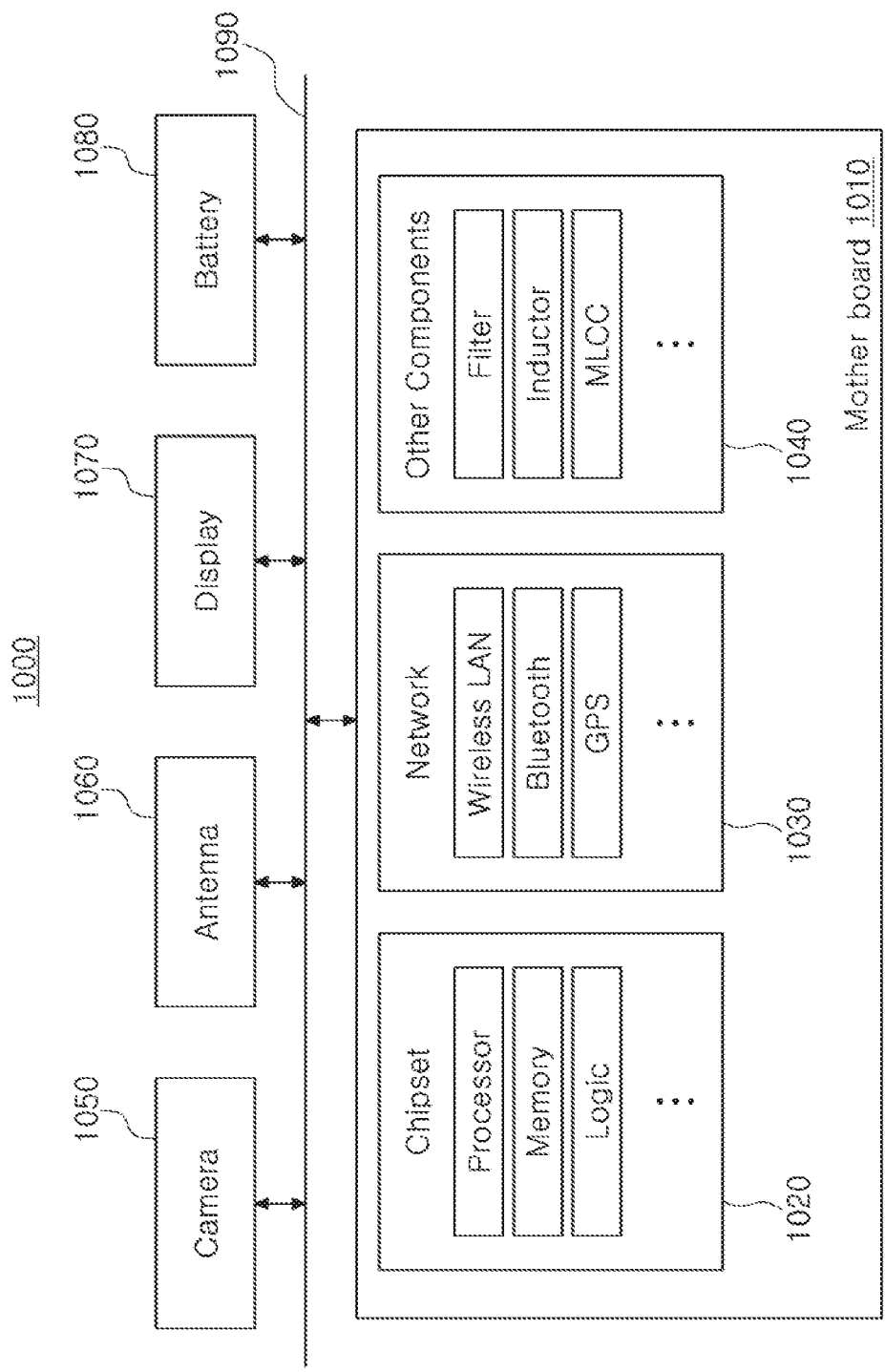
FIG. 1 is a schematic block diagram illustrating an example of an electronic device system.

Hereinafter, embodiments of the present disclosure will be described with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being 'on,' 'connected to,' or 'coupled to' another element, it can be directly 'on,' 'connected to,' or 'coupled to' the other element or other elements intervening therebetween may be present. In contrast, when an element is referred to as being 'directly on,' 'directly connected to,' or 'directly coupled to' another element, there may be no other elements or layers intervening therebetween. Like numerals refer to like elements throughout. As used herein, the term 'and/or' includes any and all combinations of one or more of the associated listed items.

It will be apparent that although the terms first, second, third, etc. may be used herein to describe various members, components, regions, layers and/or sections, any such members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as 'above,' 'upper,' 'below,' and 'lower' and the like, may be used herein for ease of description to describe one element's relationship relative to another element(s) as shown in the figures. It will be understood that spatially relative terms are intended to encompass different orientations of the device in use or operation, in addition to the orientation depicted in the figures. For example, if the device in the figures is turned over, elements described as 'above,' or 'upper' relative to other elements would then be oriented 'below,' or 'lower' relative to the other elements or features. Thus, the term 'above' can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms 'a,' 'an,' and 'the' are intended to include the plural forms as well, unless the context clearly indicates otherwise. It will be further understood that the terms 'comprises,' and/or 'comprising' when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted alone, in combination or in partial combination.

The contents of the present disclosure described below may have a variety of configurations and propose only a required configuration herein, but are not limited thereto.

Electronic Device

FIG. 1 is a schematic block diagram illustrating an example of an electronic device system.

Referring to FIG. 1, an electronic device 1000 may accommodate a motherboard 1010 therein. The motherboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, and may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access + (HSPA+), high speed downlink packet access + (HSDPA+), high speed uplink packet access + (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, and may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the motherboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device for processing data.

Figure 2:
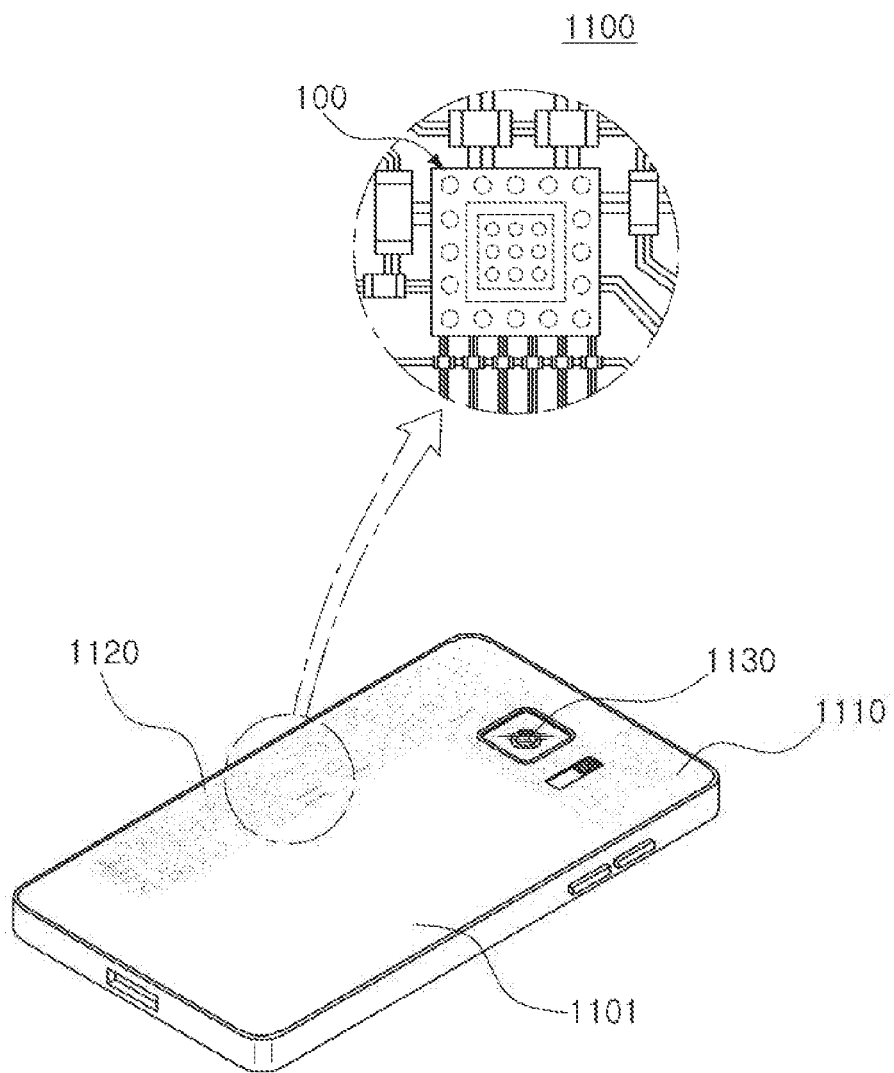
FIG. 2 is a schematic perspective view illustrating an example of an electronic device.

FIG. 2 is a schematic perspective view illustrating an example of an electronic device.

Referring to FIG. 2, a semiconductor package may be applied to various electronic devices for various purposes, as described above. For example, a mainboard 1110 is accommodated in a body 1101 of a smartphone 1100, and various components 1120 are physically and/or electrically connected to each other in the mainboard 1110. Moreover, other components physically and/or electrically connected to the mainboard 1110 or not physically and/or electrically connected thereto, such as a camera 1130 are accommodated in the body 1101. A portion of the component 1120 may be a chip related component. A semiconductor package 100 may be, for example, an application processor, but is not limited thereto. An electronic device is not necessarily limited to the smartphone 1100, and may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figures 3A, 3B:
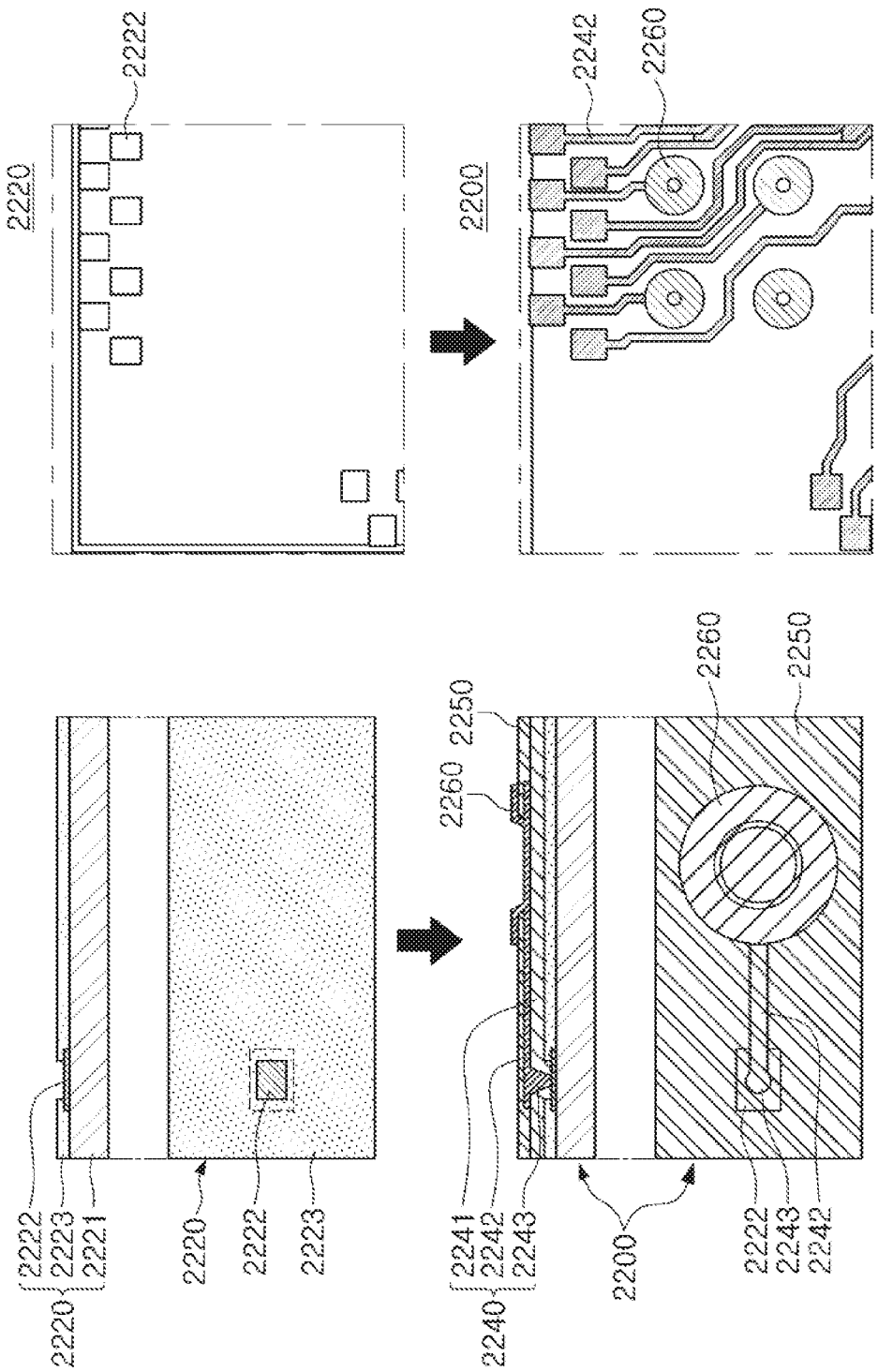
FIGS. 3A and 3B are schematic cross-sectional views illustrating states of a fan-in semiconductor package before and after being packaged.

FIGS. 3A and 3B are schematic cross-sectional views illustrating states of a fan-in semiconductor package before and after being packaged.

Figure 4:
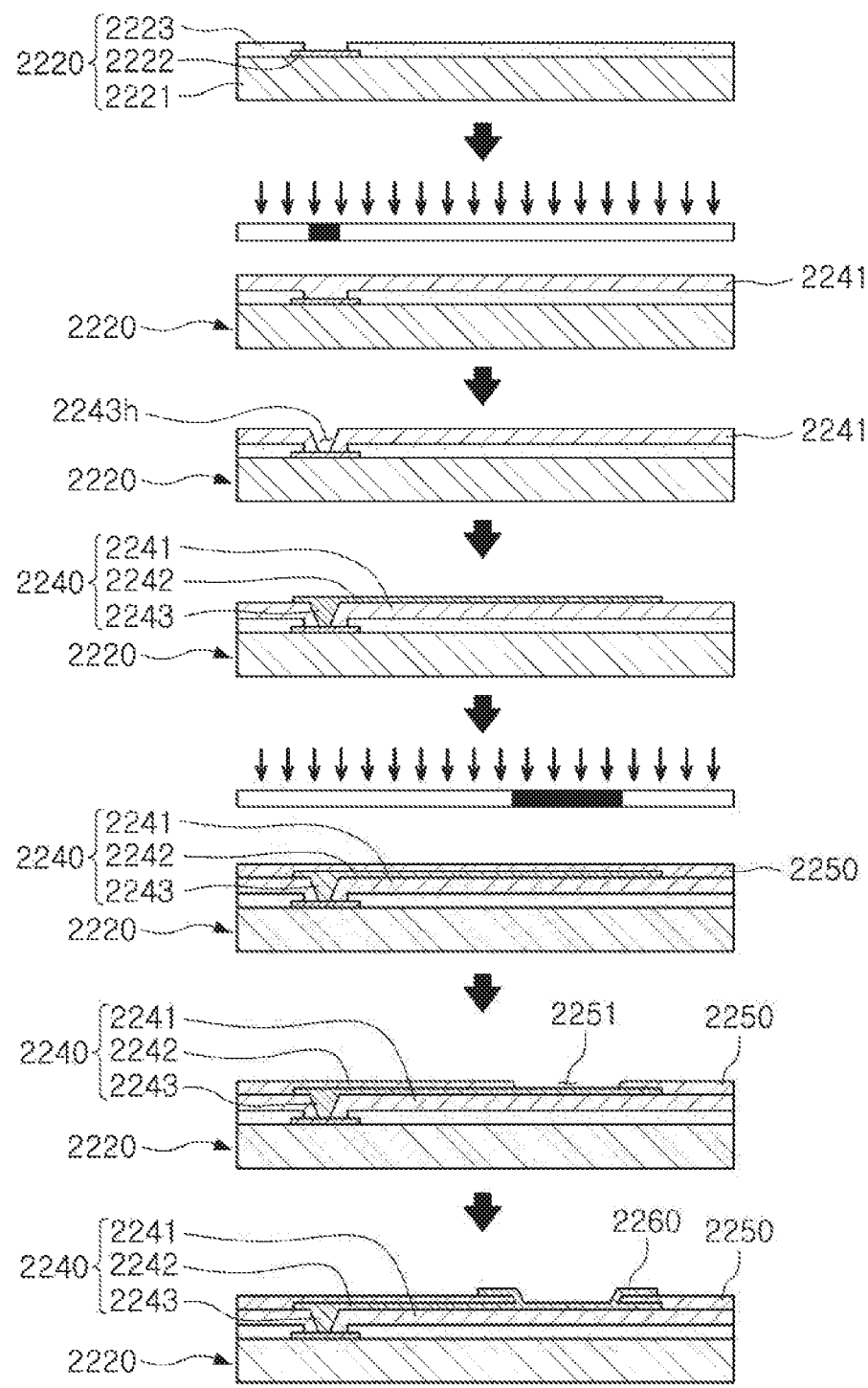
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3 and 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as photoimagable dielectric (PID) resin, forming via holes 2243h opening the connection pads 2222, and then forming distribution patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the under-bump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and may be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has a large spatial limitation. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even in a case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
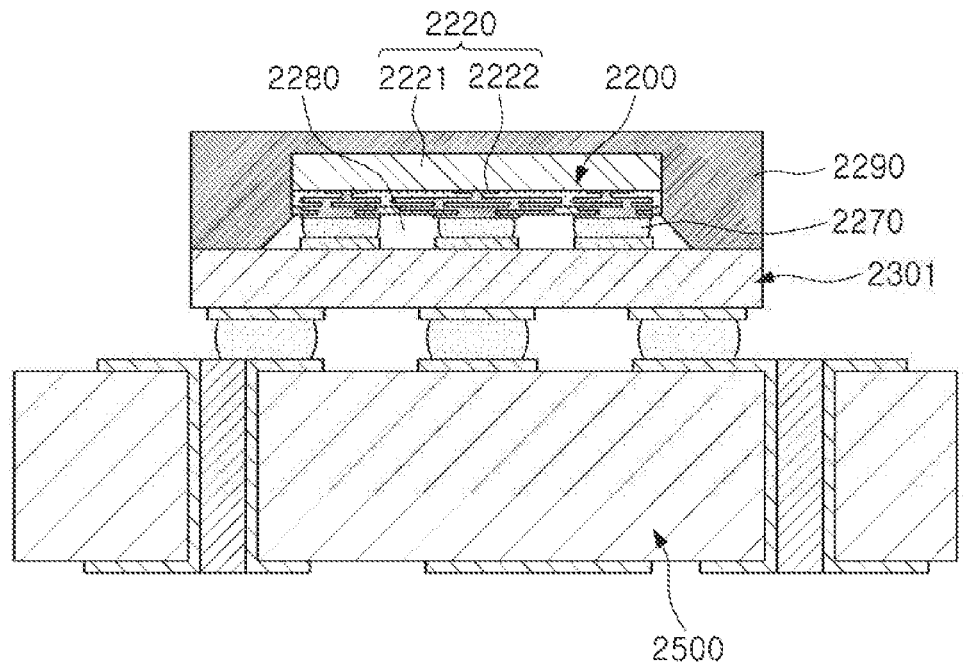
FIG. 5 is a schematic cross-sectional view illustrating a case in which a fan-in semiconductor package is mounted on an interposer substrate and is ultimately mounted on a mainboard of an electronic device.

FIG. 5 is a schematic cross-sectional view illustrating a case in which a fan-in semiconductor package is mounted on an interposer substrate and is ultimately mounted on a mainboard of an electronic device.

Figure 6:
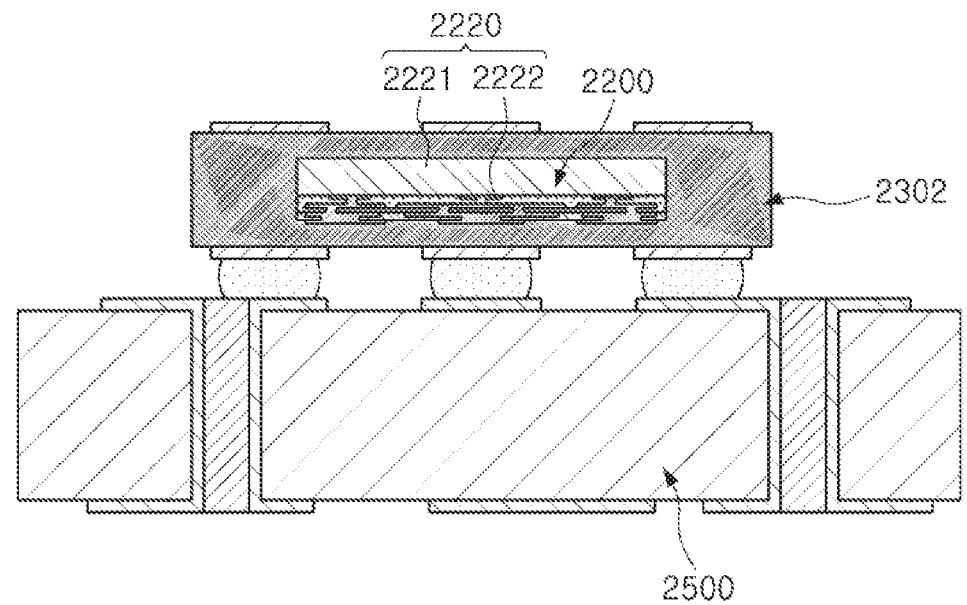
FIG. 6 is a schematic cross-sectional view illustrating a case in which a fan-in semiconductor package is embedded in an interposer substrate and is ultimately mounted on a mainboard of an electronic device.

FIG. 6 is a schematic cross-sectional view illustrating a case in which a fan-in semiconductor package is embedded in an interposer substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through an interposer substrate 2301, and the fan-in semiconductor package 2200 may be ultimately mounted on a mainboard 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which it is embedded in the interposer substrate.

Fan-Out Semiconductor Package

Figure 7:
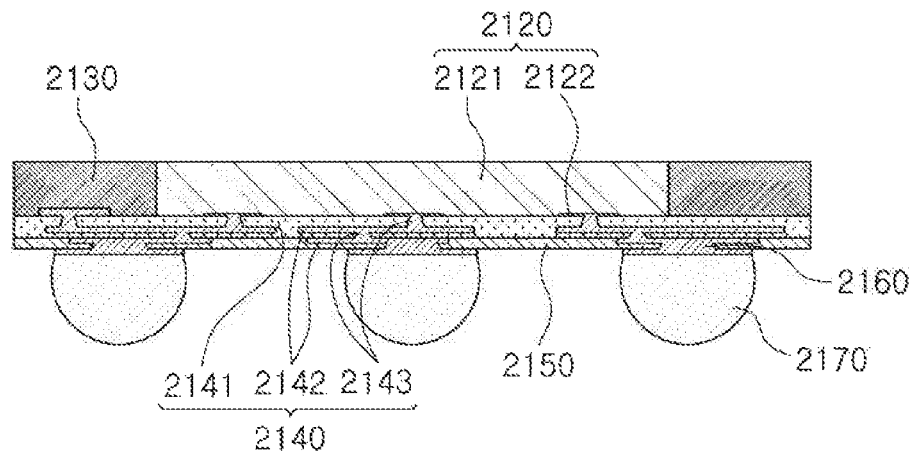
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case that a size of the semiconductor chip is decreased, a standardized ball layout may be used in the fan-out semiconductor package as it is, such that the fan-out semiconductor package may be mounted on the mainboard of the electronic device without using a separate interposer substrate, as described below.

Figure 8:
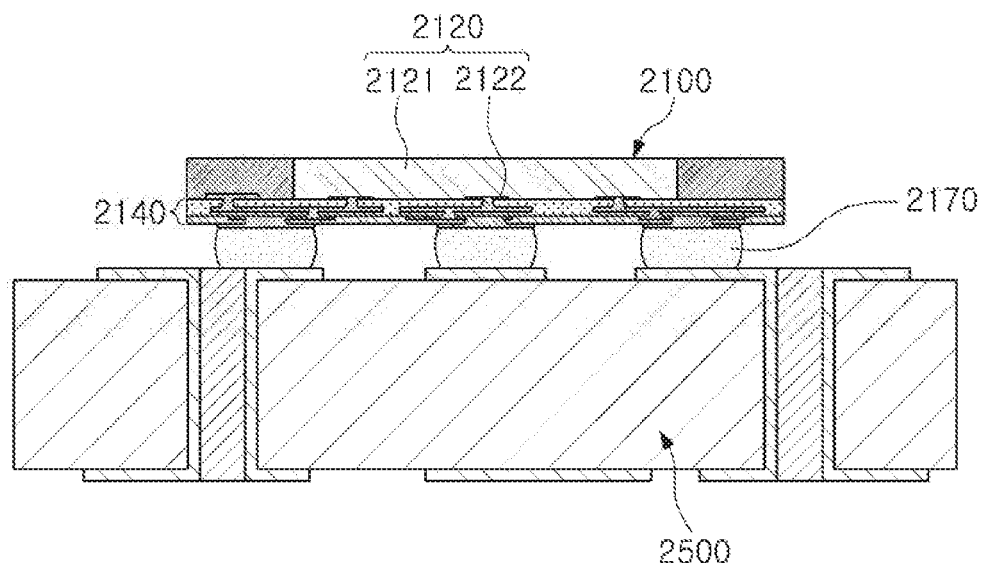
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is conceptually different from that of a printed circuit board (PCB) such as an interposer substrate, or the like, having a scale, a purpose, and the like, different from those of the fan-out semiconductor package, and having the fan-in semiconductor package embedded therein.

Hereinafter, a fan-out fingerprint sensor package to which a fan-out semiconductor package technology described above is applied will be described with reference to the drawings.

Figure 9:
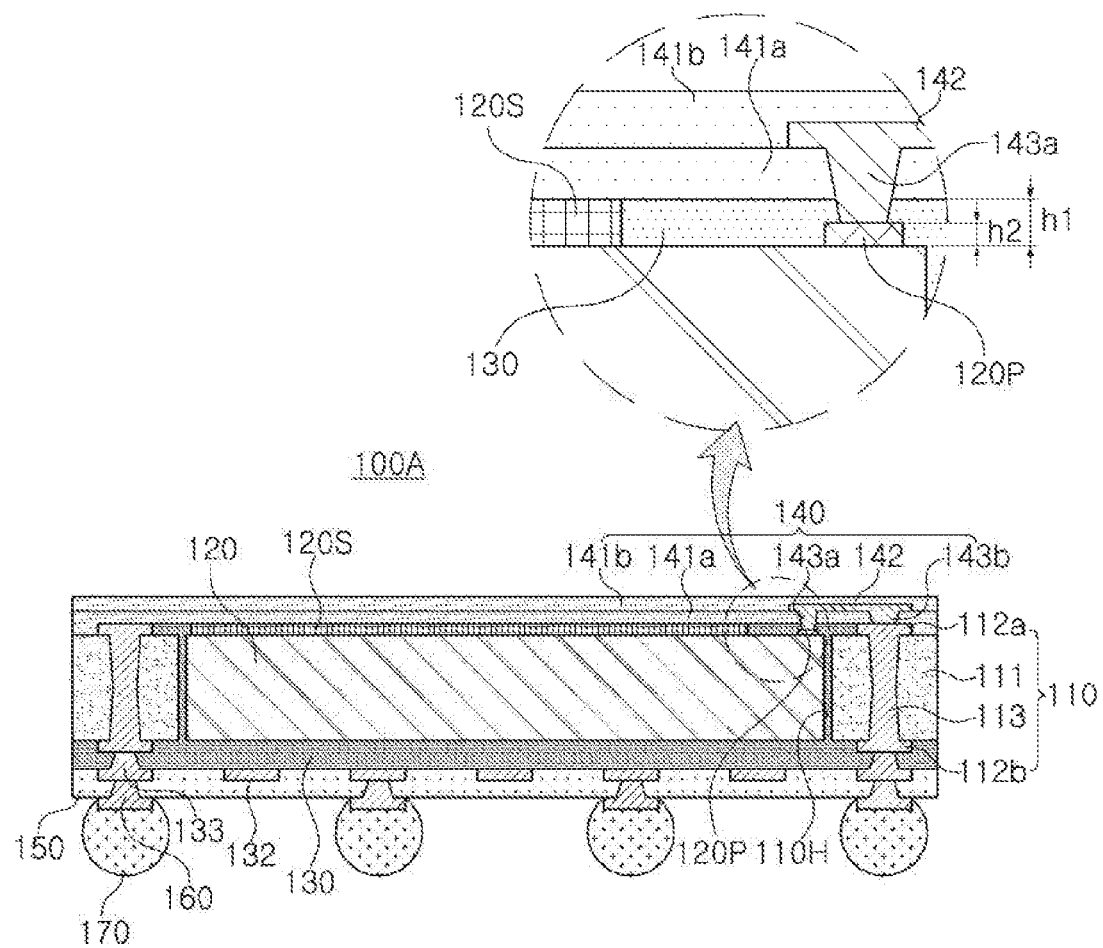
FIG. 9 is a schematic cross-sectional view illustrating an example of a fan-out fingerprint sensor package.

FIG. 9 is a schematic cross-sectional view illustrating an example of a fan-out fingerprint sensor package.

Figure 10:
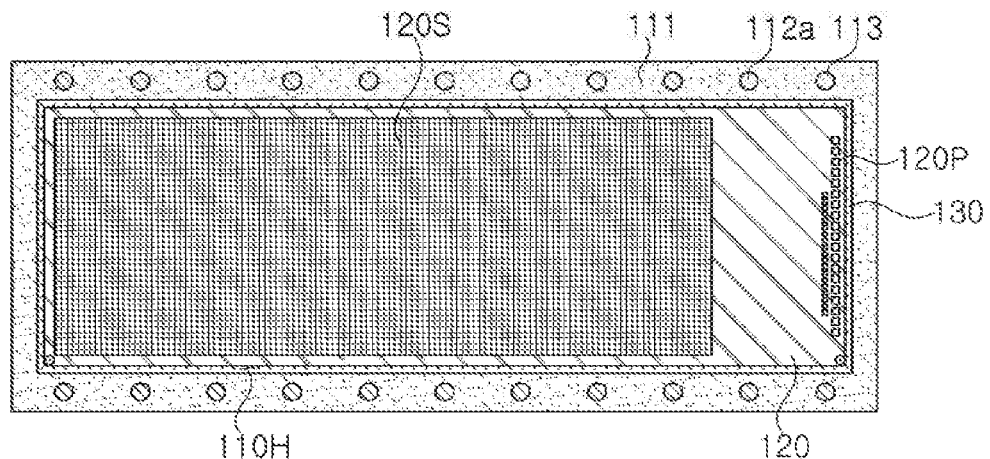
FIG. 10 is a schematic plan view illustrating a form of a fingerprint sensor and a first connection member, of the fan-out fingerprint sensor package of FIG. 9, viewed from above.

FIG. 10 is a schematic plan view illustrating a form of a fingerprint sensor and a first connection member, of the fan-out fingerprint sensor package of FIG. 9, seen through from above.

Figure 11:
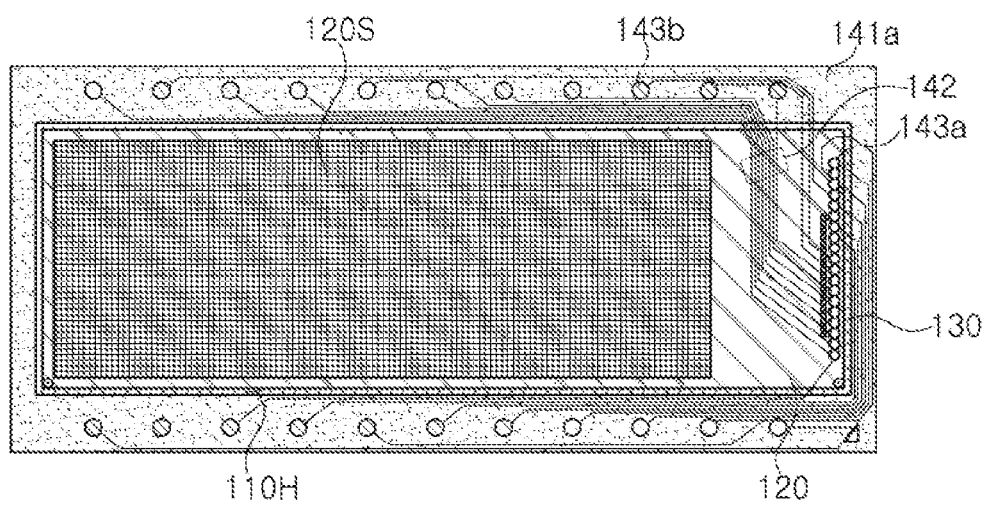
FIG. 11 is a schematic plan view illustrating a form of a fingerprint sensor and a second connection member of the fan-out fingerprint sensor package of FIG. 9, viewed from above.

FIG. 11 is a schematic plan view illustrating a form of a fingerprint sensor and a second connection member, of the fan-out fingerprint sensor package of FIG. 9, seen from above.

Referring to FIGS. 9, 10, and 11, the fan-out fingerprint sensor package 100A may include the first connection member 110 having a through-hole 110H, the fingerprint sensor 120 disposed in the through-hole 110H of the first connection member 110 and having an active surface having connection pads 120P and sensing patterns 120S, disposed thereon, and an inactive surface opposing the active surface, an encapsulant 130 encapsulating at least portions of the first connection member 110 and the fingerprint sensor 120, and the second connection member 140 disposed on the first connection member 110 and the active surface of the fingerprint sensor 120, byway of example. The first connection member 110 may include a plurality of distribution layers 112a and 112b electrically connected to the connection pads 120P. The second connection member 140 may include the redistribution layers 142 electrically connected to the connection pads 120P. The connection pads 120P of the fingerprint sensor 120 are electrically connected to the redistribution layers 142 of the second connection member 140 through first vias 143a, and the redistribution layers 142 of the second connection member 140 are electrically connected to the first distribution layer 112a of the first connection member 110 through second vias 143b. In other words, the connection pads 120P of the fingerprint sensor 120 are electrically connected to the first connection member 110 through the second connection member 140, and are electrically connected to the electrical connection structures 170 as illustrated later through the first connection member 110. Thus, the connection pads 120P may be electrically connected to a mainboard of an electronic device through the electrical connection structures 170.

A fingerprint sensor structure according to the related art may have a structure using a ball grid array substrate in general. For example, a fingerprint sensor is disposed on a ball grid array substrate, and the fingerprint sensor is electrically connected to the ball grid array substrate by wire bonding and is molded with a molding material. However, in the structure described above, a sensing pattern layer having a separate fingerprint recognition function is formed on a ball grid array substrate and a fingerprint sensor. In detail, a molding thickness is inevitably thickened by wire bonding. Thus, a problem in which a sensing distance from a touch panel becomes significant, so sensing sensitivity is low, may occur. Moreover, a ball grid array substrate itself has a significant thickness, so it is disadvantageous to the thinning. In addition, due to an asymmetrical structure, warpage of a package occurs significantly, so problems in which fingerprint sensing sensitivity is reduced and yield when a package is mounted on a board is reduced may occur.

On the other hand, the fan-out fingerprint sensor package 100A has a structure in which the first connection member 110 having the first distribution layers 112a and the second distribution layers 112b is introduced rather than a ball grid array (BGA) substrate, the fingerprint sensor 120 having the sensing patterns 120S itself having a fingerprint sensor function is disposed in the through-hole 110H of the first connection member 110 and is encapsulated by the encapsulant 130, and the connection pads 120P of the fingerprint sensor 120 is electrically connected to the first distribution layers 112a and the second distribution layers 112b of the first connection member 110 using the second connection member 140 having the redistribution layers 142 as well as the vias 143a and 143b. Thus, as compared to a fingerprint sensor structure according to the related art, ultra-miniaturization and ultra-thinning may be possible, and a sensing distance may be significantly reduced. Furthermore, the fan-out fingerprint sensor package 100A may control warpage of the fan-out fingerprint sensor package 100A through the first connection member 110 and the encapsulant 130, so the defect described above may be significantly reduced. For example, a suitable thickness and a suitable material of the first connection member 110 are selected, so stiffness required for the fan-out fingerprint sensor package 100A may be obtained. Moreover, as the encapsulant 130 is used, a substantially symmetrical structure to the second connection member 140 may be implemented while the fingerprint sensor 120 is protected, so warpage of the fan-out fingerprint sensor package 100A may be controlled.

On the other hand, in the fan-out fingerprint sensor package 100A, the encapsulant 130 encapsultes a side surface and an inactive surface of the fingerprint sensor 120 while encapsulating at least a portion of the connection pads 120P on an active surface. In this case, the first vias 143a pass through the first insulating layer 141a and at least a portion of the encapsulant 130, and the second vias 143b pass through the first insulating layer 141a. In other words, a height of the first vias 143a is greater than that of the second vias 143b. In this regard, the sensing patterns 120S are disposed on a central portion and one side of an active surface, and the connection pads 120P are disposed on the other side of the active surface. In this case, a thickness h1 of the sensing patterns 120S may be greater than a thickness h2 of the connection pads 120P. Through the disposition described above, the connection pads 120P may be redistributed to a shortest path to be electrically connected to the electrical connection structures 170.

On the other hand, no redistribution layers may be formed on the sensing patterns 120S of the fingerprint sensor 120. In other words, based on the second connection member 140, as compared to the central portion and one side of the active surface, the other side of the active surface may be provided with a greater amount of redistribution layers. Through the disposition described above, as a metal ratio of the sensing patterns 120S and the redistribution layers 142 in one unit area is adjusted, a coefficient of thermal expansion (CTE) may be controlled, so it may be effective for controlling warpage.

Hereinafter, respective components included in the fan-out fingerprint sensor package 100A will be described in more detail.

The first connection member 110 may maintain stiffness of the fan-out fingerprint sensor package 100A depending on a specific material, and may serve to secure thickness uniformity of the encapsulant 130. By means of the first connection member 110, the connection pads 120P of the fingerprint sensor 120 may be electrically connected to a mainboard of an electronic device through the electrical connection structures 170. As the first connection member 110 includes a plurality of distribution layers, the first distribution layers 112a and the second distribution layers 112b, the connection pads 120P of the fingerprint sensor 120 may be effectively redistributed and a wide distribution design area may be provided, so it may be significantly reduced that redistribution layers are formed on other regions. The fingerprint sensor 120 is disposed in the through-hole 110H to be spaced apart from the first connection member 110 by a predetermined distance. The periphery of a side surface of the fingerprint sensor 120 may be surrounded by the first connection member 110.

The first connection member 110 may include a support layer 111, a first distribution layer 112a disposed on an upper surface of the support layer 111, a second distribution layer 112b disposed on a lower surface of the support layer 111, and a via layer 113 allowing the first distribution layers 112a to the second distribution layers 112b to be electrically connected to each other while passing through the support layer 111. If necessary, an insulating layer forming the first connection member 110 may be configured to have multiple layers. In this case, distribution layers and via layers, having multiple layers, may be included. For example, distribution layers may be disposed between insulating layers.

A material of the support layer 111 may be, for example, a material including an inorganic filler and an insulating resin. For example, the material of the support layer may be a resin including a reinforcing material such as an inorganic filler such as silica and alumina together with a thermosetting resin such as an epoxy resin, a thermoplastic resin such as a polyimide resin, for example, an Ajinomoto Build-up Film (ABF), FR-4, Bismaleimide Triazine (BT), or the like. In this case, excellent stiffness may be maintained, so the first connection member 110 may be used as a type of support member.

The first distribution layers 112a and the second distribution layers 112b may include a conductive material such as copper (Cu), aluminum (Al), silver (Ag), tin (Sn), gold (Au), nickel (Ni), lead (Pb), titanium (Ti), or alloys thereof. The first distribution layers 112a and the second distribution layers 112b may perform various functions depending on designs of their corresponding layers. For example, the first distribution layers 112a and the second distribution layers 112b may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the signal (S) patterns may include pad patterns for a via, pad patterns for a connection terminal, and the like. A thickness of the first distribution layers 112a and the second distribution layers 112b of the first connection member 110 may be greater than a thickness of the redistribution layers 142 of the second connection member 140. In this regard, while the first connection member 110 may have a thickness in a degree of the fingerprint sensor 120, thinning of the second connection member 140 is required.

The via layer 113 may allow the first distribution layer 112a and the second distribution layer 112b to be electrically connected to each other while passing through the support layer 111. A formation material of the via layer 113 may be a conductive material. The via layer 113 may be entirely filled with a conductive material, or a conductive material may be formed along a wall of a via hole. The via layer 113 may be in the form of a through via, entirely passing through the support layer 111, and the via layer may have a cylindrical or hourglass shape, but is not limited thereto.

The fingerprint sensor 120 may be an integrated circuit (IC) in which several hundreds to several millions of devices are integrated into a single chip. The fingerprint sensor 120 may be formed, based on an active wafer. In this case, silicon (Si), germanium (Ge), gallium arsenide (GaAs), or the like, may be used for a base material forming a body. The connection pads 120P are provided to allow the fingerprint sensor 120 to be electrically connected to other components, and a formation material of the connection pads 120P may be a conductive material such as aluminum (Al), or the like, without limitations. A side on which the connection pads 120P are disposed is an active surface, and the fingerprint sensor 120 having the sensing patterns 120S is capable of fingerprint sensor processing on the active surface. The sensing patterns 120S may recognize a fingerprint by precisely detecting a change in capacitance, and may include, for example, a transfer transistor (Tx) pattern and a reset transistor (Rx) pattern. If necessary, a passivation film (not shown) covering at least a portion of the connection pads 120P may be formed on the body. The passivation film (not shown) may be an oxide film, a nitride film, or the like, or may be a double layer of an oxide film and a nitride film. An insulating film (not shown) or the like may be further disposed in a necessary position.

The encapsulant 130 may protect the fingerprint sensor 120. An encapsulation form of the encapsulant 130 is not particularly limited, but may be a form in which the encapsulant 130 surrounds at least a portion of the fingerprint sensor 120. For example, the encapsulant 130 may cover a side surface and an inactive surface of the first connection member 110 and the fingerprint sensor 120, and may fill at least a portion of a space between a wall of the through-hole 110H and a side surface of the fingerprint sensor 120. Moreover, at least a portion on the connection pads 120P on an active surface of the fingerprint sensor 120 may be covered. A certain material of the encapsulant 130 is not particularly limited, but may be, for example, an insulating material. In this case, the insulating material may be a thermosetting resin such as an epoxy resin, a thermoplastic resin such as a polyimide resin, a resin including a reinforcing material such as an inorganic filler, together with the thermosetting resin and the thermoplastic resin, for example, ABF, FR-4, BT, PID resin, or the like. In addition, a known molding material such as EMC or the like may be also used. If necessary, a resin in which the thermosetting resin or the thermoplastic resin is impregnated in a core material, together with an inorganic filler such as a glass fiber (or a glass cloth or a glass fabric), may be used. Meanwhile, the encapsulant 130 may be formed by adjusting a material and a thickness so as to be symmetrical to the second connection member 140 based on the first connection member 110 for warpage control.

Backside redistribution layers 132 may be disposed on the encapsulant 130. Moreover, in the encapsulant 130, the backside vias 133 passing through at least a portion of the encapsulant 130 and allowing the second distribution layers 112b of the first connection member 110 and the backside redistribution layers 132 to be electrically connected to each other may be formed therein. By means of formation of the backside redistribution layers 132, a fan-in region on the encapsulant 130 may be used as a routing region. Thus, a larger amount of electrical connection structures 170 may be formed.

The second connection member 140 may include the redistribution layers 142 redistributing the connection pads 120P of the fingerprint sensor 120. Through the second connection member 140, several tens to several hundreds of connection pads 120P having various functions may be redistributed, and may be physically and/or electrically connected externally, depending on a function through the electrical connection structures 170. The second connection member 140 may include a first insulating layer 141a, redistribution layers 142 disposed on the first insulating layer 141a, vias 143a and 143b connected to the redistribution layers 142, and a second insulating layer 141b disposed on the first insulating layer 141a and covering the redistribution layers 142.

A material of the first insulating layer 141a and the second insulating layer 141b may be an insulating material. In this case, a photosensitive insulating material such as PID resin may also be used as the insulating material. In this case, it may be advantageous to form a fine pattern. The materials of the first insulating layer 141a and the second insulating layer 141b may be the same. The first insulating layer 141a and the second insulating layer 141b may be integrated with each other depending on a process, such that a boundary therebetween may not be apparent.

The redistribution layers 142 may include a conductive material such as copper (Cu), aluminum (Al), silver (Ag), tin (Sn), gold (Au), nickel (Ni), lead (Pb), titanium (Ti), or alloys thereof. The redistribution layers 142 may perform various functions depending on designs of their corresponding layers. For example, the redistribution layers 142 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the signal (S) patterns may include pad patterns for a via, pad patterns for a connection terminal, and the like. The redistribution layers 142 may include an ultra-sensitive fingerprint recognition pattern if necessary.

No redistribution layers may be formed on the sensing patterns 120S of the fingerprint sensor 120. In other words, based on the center of the second connection member 140, on a central portion and one side of an active surface, a larger amount of redistribution layers may be formed on the other side of the active surface where the sensing patterns 120S are not formed. Through the disposition described above, as a metal ratio of the sensing patterns 120S and the redistribution layers 142 in one unit area is adjusted, a coefficient of thermal expansion (CTE) may be controlled, so it may be effective for controlling warpage.

The vias 143a and 143b may electrically connect the connection pads 120P, the redistribution layers 142, the first distribution layer 112a, or the like, formed on different layers to each other, resulting in an electrical path in the fan-out fingerprint sensor package 100A. A material of each of the vias 143a and 143b may be a conductive material such as copper (Cu), aluminum (Al), silver (Ag), tin (Sn), gold (Au), nickel (Ni), lead (Pb), titanium (Ti), or alloys thereof.

Each of the vias 143a and 143b may be entirely filled with the conductive material, or the conductive material may also be formed along a wall of each of the vias. In addition, each of the vias 143a and 143b may have all of the shapes known in the related art, such as a tapered shape, a cylindrical shape, or the like. The first vias 143a allow the redistribution layers 142 and the connection pads 120P to be electrically connected, while the second vias 143b allow the redistribution layers 142 and the first distribution layer 112a to be electrically connected.

The first vias 143a may pass through the first insulating layer 141a and at least a portion of the encapsulant 130, and the second vias 143b may pass through the first insulating layer 141a. In other words, a height of the first vias 143a may be greater than a height of the second vias 143b. In this regard, the sensing patterns 120 are disposed on a central portion and one side of an active surface, and the connection pads 120P are disposed on the other side of the active surface. In this case, a thickness h1 of the sensing patterns 120S may be greater than a thickness h2 of the connection pads 120P. Through the disposition described above, the connection pads 120P are redistributed to a shortest path to be electrically connected to the electrical connection structures 170.

A passivation layer 150 may be an additional configuration for protecting the backside redistribution layers 132. The passivation layer 150 may have an opening exposing at least a portion of the backside redistribution layers 132. The underbump metal layer 160 may be formed in the opening. The passivation layer 150 may be an ABF including an insulating resin and an inorganic filler, or the like, but is not limited thereto.

The underbump metal layer 160 may be an additional configuration for improving connection reliability of the electrical connection structures 170, and for improving board level reliability of the fan-out fingerprint sensor package 100A. The underbump metal layer 160 may be connected to the backside distribution layer 132 open through openings of the passivation layer 150. The underbump metal layer 160 may be formed in the openings of the passivation layer 150 by the known metallization method using the known conductive material such as a metal, but is not limited thereto.

The electrical connection structures 170 may be additionally configured to physically or electrically externally connect the fan-out fingerprint sensor package 100A. For example, the fan-out fingerprint sensor package 100A may be mounted on the mainboard of the electronic device through the electrical connection structures 170. Each of the electrical connection structures 170 may be formed of a conductive material, for example, a solder, or the like. However, this is only an example, and a material of each of the electrical connection structures 170 is not limited thereto. Each of the electrical connection structures 170 may be a land, a ball, a pin, or the like. The electrical connection structures 170 may be formed as a multilayer or single layer structure. When the electrical connection structures 170 are formed as a multilayer structure, the electrical connection structures 170 may include a copper (Cu) pillar and a solder. When the electrical connection structures 170 are formed as a single layer structure, the electrical connection structures 170 may include a tin-silver solder or copper (Cu). However, this is only an example, and the electrical connection structures 170 are not limited thereto.

The number, an interval, a disposition form, and the like, of electrical connection structures 170 are not particularly limited, but may be sufficiently modified depending on design particulars by those skilled in the art. For example, the electrical connection structures 170 may be provided in an amount of several tens to several thousands according to the number of connection pads 120P of the fingerprint sensor 120, or may be provided in an amount of several tens to several thousands or more or several tens to several thousands or less.

At least one of the electrical connection structures 170 may be disposed in a fan-out region. The fan-out region is a region except for a region in which the fingerprint sensor 120 is disposed. In other words, the fingerprint sensor package 100A may be a fan-out package by way of example. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness while being mounted on an electronic device without a separate board, and may have price competitiveness.

Meanwhile, it is not limited in the drawings, but a metal layer may be further disposed on a wall of the through-hole 110H if necessary. The metal layer may serve to effectively release heat generated from the fingerprint sensor 120. Moreover, the metal layer may also serve to shield electromagnetic waves. In addition, if necessary, another semiconductor chip or another passive component may be disposed together in the through-hole 110H. Moreover, if necessary, the through-hole 110H may be provided as a plurality of through-holes, while a fingerprint sensor, a semiconductor chip, and/or a passive component may be disposed in each through-hole 110H.

Figure 12:
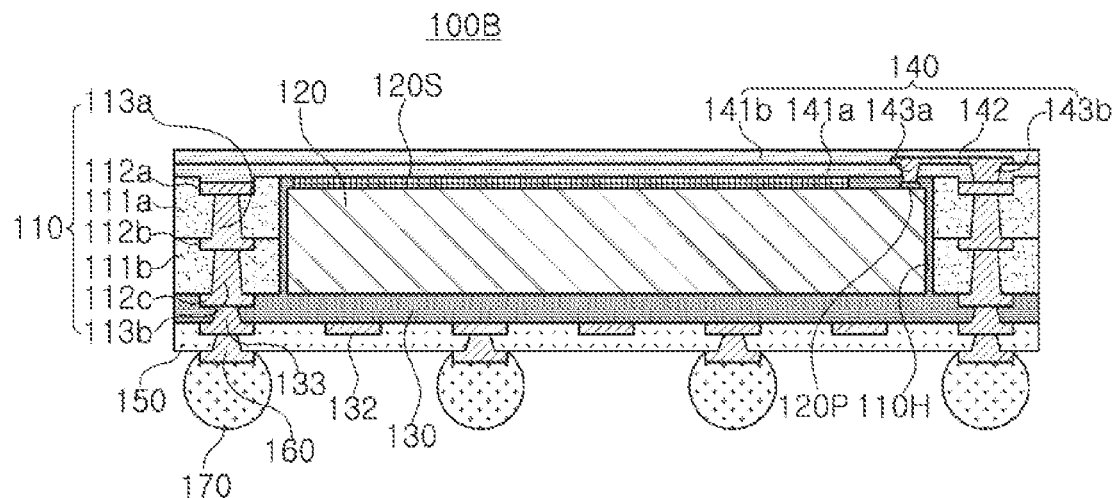
FIG. 12 is a schematic cross-sectional view illustrating another example of a fan-out fingerprint sensor package.

FIG. 12 is a schematic cross-sectional view illustrating another example of a fan-out fingerprint sensor package.

Referring to FIG. 12, in a fan-out fingerprint sensor package 100B according to another exemplary embodiment, a first connection member 110 may include a first support layer 111a, a first distribution layer 112a in contact with the first insulating layer 141a and embedded in one surface of the first support layer 111a, a second distribution layer 112b disposed on the other surface of the first support layer 111a opposing one surface in which the first distribution layer 112a is embedded, a second support layer 111b disposed on the first support layer 111a and covering the second distribution layer 112b, and a third distribution layer 112c disposed on the second support layer 111b. The first distribution layer 112a, the second distribution layer 112b, and the third distribution layer 112c may be electrically connected to the connection pads 120P. The first distribution layer 112a and the second distribution layer 112b as well as the second distribution layer 112b and the third distribution layer 112c may be electrically connected through a first via layer 113a and a second via layer 113b, passing through the first support layer 111a and the second support layer 111b, respectively.

As the first distribution layer 112a is embedded, an insulating distance of an insulating layer of the second connection member 140 may be substantially constant. The first connection member 110 includes a large number of distribution layers 112a, 112b, and 112c, so the second connection member 140 may be further simplified. Thus, a yield reduction caused by a defect occurring during formation of the second connection may be improved, and thinning may be possible. The first distribution layer 112a may be recessed inwardly of the first support layer 111a, so that a surface of the first support layer 111a, in contact with the first insulating layer 141a, and a surface of the first distribution layer 112a, in contact with the first insulating layer 141a, may be stepped. As a result, the first distribution layer 112a may be prevented from being contaminated by bleeding of a formation material of the encapsulant 130 when the encapsulant 130 is formed.

The second distribution layers 112b of the first connection member 110 may be located between an active surface and an inactive surface of the fingerprint sensor 120. The first connection member 110 may be formed to have a thickness corresponding to a thickness of the fingerprint sensor 120, so the second distribution layer 112b formed in the first connection member 110 may be disposed on a level between an active surface and an inactive surface of the fingerprint sensor 120. The thickness of each of the distribution layers 112a, 112b, and 112c of the first connection member 110 may be greater than a thickness of a redistribution layer 142 of the second connection member 140. The first connection member 110 may have a thickness, equal to or greater than that of the fingerprint sensor 120, so the distribution layers 112a, 112b, and 112c may be formed to have a larger size according to a scale. On the other hand, the redistribution layer 142 of the second connection member 140 formed through a microcircuit process such as a semiconductor process, or the like, may be formed to have a relatively smaller size for thinning. Other descriptions are substantially the same as those described above, and will thus be omitted.

Figure 13:
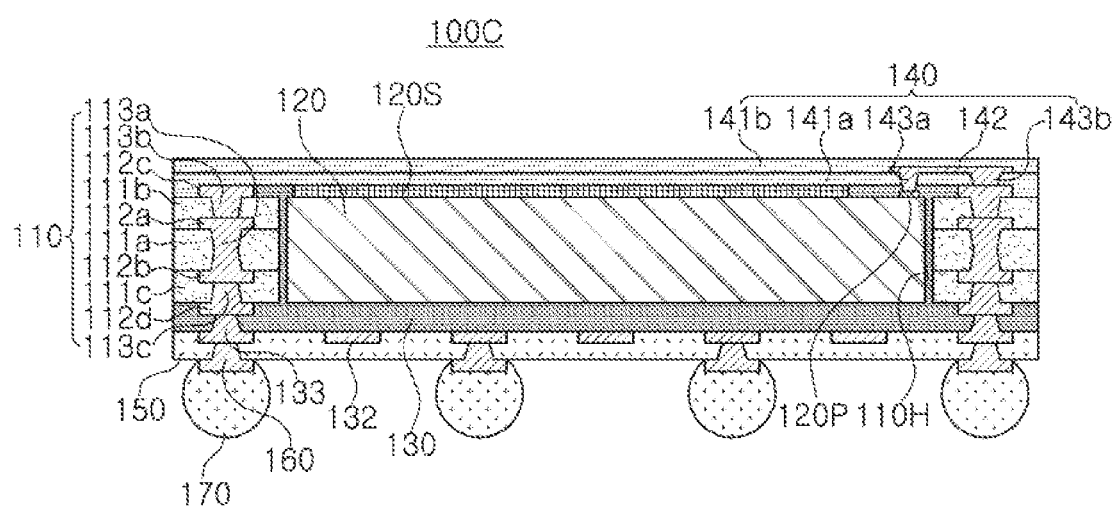
FIG. 13 is a schematic cross-sectional view illustrating another example of a fan-out fingerprint sensor package.

FIG. 13 is a schematic cross-sectional view illustrating another example of a fan-out fingerprint sensor package.

Referring to FIG. 13, in a fan-out fingerprint sensor package 100C according to another exemplary embodiment, a first connection member 110 may include a first support layer 111a, a first distribution layer 112a disposed on one side of the first support layer 111a, a second distribution layer 112b disposed on the other side of the first support layer 111a, a second support layer 111b disposed on the first distribution layer 112a and covering the first distribution layer 112a, a third distribution layer 112c disposed on the second support layer 111b, a third support layer 111c disposed on the first support layer 111a and covering the second distribution layer 112b, and a fourth distribution layer 112d disposed on the third support layer 111c. The first distribution layer 112a, the second distribution layer 112b, the third distribution layer 112c, and the fourth distribution layer 112d are electrically connected to the connection pads 120P. The first connection member 110 includes a larger amount of distribution layers 112a, 112b, 112c, and 112d, so the second connection member 140 may be further simplified. The first distribution layer 112a, the second distribution layer 112b, the third distribution layer 112c, and the fourth distribution layer 112d may be electrically connected to each other through a first via layer 113a, a second via layer 113b, and a third via layer 113c, passing through the first insulating layer 111a, the second insulating layer 111b, and the third insulating layer 111c, respectively.

The first support layer 111a may have a thickness greater than those of the second support layer 111b and the third support layer 111c. The first support layer 111a may be relatively thicker to maintain stiffness, basically, while the second support layer 111b and the third support layer 111c may be introduced for forming a larger amount of the third distribution layer 112c and the fourth distribution layer 112d. The first support layer 111a may include an insulating material different from those of the second support layer 111b and the third support layer 111c. For example, the first support layer 111a may be, for example, prepreg including a core material, an inorganic filler, and an insulating resin, and the second support layer 111b and the third support layer 111c may be an ABF or a PID film including an inorganic filler and an insulating resin. In a similar aspect, a diameter of the first via layer 113a may be greater than those of the second via layer 113b and the third via layer 113c.

An upper surface of the third distribution layer 112c of the first connection member 110 may be located above an upper surface of the connection pads 120P of the fingerprint sensor 120. Moreover, a distance between a redistribution layer 142 of the second connection member 140 and the third distribution layer 112c of the first connection member 110 may be smaller than a distance between the redistribution layer 142 of the second connection member 140 and a connection pad 120P of the fingerprint sensor 120. In this regard, the third distribution layer 112c may be disposed in a form protruding from the second support layer 111b, and thus may be in contact with the first insulating layer 141a. The first distribution layer 112a and the second distribution layer 112b of the first connection member 110 may be located between an active surface and an inactive surface of the fingerprint sensor 120. The first connection member 110 may be formed to have a thickness corresponding to a thickness of the fingerprint sensor 120, so the first distribution layer 112a and the second distribution layer 112b, formed in the first connection member 110, may be disposed at a level between the active surface and the inactive surface of the fingerprint sensor 120.

A thickness of the distribution layers 112a, 112b, 112c, and 112d of the first connection member 110 may be greater than a thickness of the redistribution layer 142 of the second connection member 140. The first connection member 110 may have a thickness equal to or greater than the fingerprint sensor 120, and thus may be formed to have a larger size than those of the distribution layers 112a, 112b, 112c, and 112d. On the other hand, the redistribution layer 142 of the second connection member 140 may be formed to have a relatively smaller size for thinning. Other descriptions are substantially the same as those described above, and will thus be omitted.

As set forth above, according to an exemplary embodiment, a novel fingerprint recognition device in the form of a fan-out package may be provided, in which sensing sensitivity is improved by significantly reducing a sensing distance while a thickness and warpage are easily controlled, and which may be easily applied to an under display.

While exemplary embodiments have been shown and described above, it will be apparent to those skilled in the art that modifications and variations could be made without departing from the scope of the present invention as defined by the appended claims.

What is claimed is:

1. A fan-out fingerprint sensor package comprising:
a first connection member having a through-hole;
a fingerprint sensor disposed in the through-hole of the first connection member, and having an active surface on which a connection pad and a sensing pattern are disposed and an inactive surface opposing the active surface;
an encapsulant encapsulating at least portions of the first connection member and the fingerprint sensor; and
a second connection member disposed on the first connection member and the active surface of the fingerprint sensor,
wherein the first connection member includes a distribution layer,
the second connection member includes a first insulating layer disposed on the distribution layer of the first connection member and the active surface of the fingerprint sensor, a redistribution layer disposed on the first insulating layer, a first via connecting the redistribution layer to the connection pad of the fingerprint sensor, and a second via connecting the redistribution layer to the distribution layer of the first connection member, the first via passes through the first insulating layer and at least a portion of the encapsulant, the second via passes through the first insulating layer, and the encapsulant encapsulates a side surface and the inactive surface of the fingerprint sensor, and encapsulates at least a portion of the connection pad on the active surface.

2. The fan-out fingerprint sensor package of claim 1, wherein the first via has a height greater than that of the second via.

3. The fan-out fingerprint sensor package of claim 1, wherein the sensing pattern is disposed in a central portion and on one side of the active surface, and the connection pad is disposed on the other side of the active surface.

4. The fan-out fingerprint sensor package of claim 3, wherein the connection pad is disposed only on the other side of the active surface.

5. The fan-out fingerprint sensor package of claim 3, wherein, based on the center of the second connection member, a larger amount of the redistribution layer is formed on the other side of the active surface, as compared to the central portion and one side of the active surface.

6. The fan-out fingerprint sensor package of claim 1, wherein the redistribution layer is not formed on the sensing pattern of the fingerprint sensor.

7. The fan-out fingerprint sensor package of claim 1, wherein the second connection member further includes a second insulating layer disposed on the first insulating layer and covering the redistribution layer.

8. The fan-out fingerprint sensor package of claim 1, wherein the first connection member includes a support layer, a first distribution layer disposed on one surface of the support layer, a second distribution layer disposed on the other surface of the support layer, and a via layer passing through the support layer and electrically connecting the first distribution layer to the second distribution layer, and the first distribution layer is the distribution layer.

9. The fan-out fingerprint sensor package of claim 8, further comprising:
a backside redistribution layer disposed on the encapsulant;
a backside via passing through at least a portion of the encapsulant, and electrically connecting the second distribution layer to the backside redistribution layer;
a passivation layer disposed on the encapsulant, and having an opening exposing at least a portion of the backside redistribution layer; and
an electrical connection structure disposed on the opening of the passivation layer, and electrically connected to the backside redistribution layer, having been exposed.

10. The fan-out fingerprint sensor package of claim 1, wherein the second via does not pass through the encapsulant.

11. A fan-out fingerprint sensor package comprising:
a first connection member having a through-hole;
a fingerprint sensor disposed in the through-hole of the first connection member, and having an active surface on which a connection pad and a sensing pattern are disposed and an inactive surface opposing the active surface;
an encapsulant encapsulating at least portions of the first connection member and the fingerprint sensor; and
a second connection member disposed on the first connection member and the active surface of the fingerprint sensor, wherein the first connection member includes a distribution layer, the second connection member includes a first insulating layer disposed on the distribution layer of the first connection member and the active surface of the fingerprint sensor, a redistribution layer disposed on the first insulating layer, a first via connecting the redistribution layer to the connection pad of the fingerprint sensor, and a second via connecting the redistribution layer to the distribution layer of the first connection member, the first via passes through the first insulating layer and at least a portion of the encapsulant, the second via passes through the first insulating layer, the first connection member includes a first support layer, a first distribution layer disposed on one surface of the first support layer, a second distribution layer disposed on the other surface of the first support layer, a first via layer passing through the first support layer and electrically connecting the first distribution layer to the second distribution layer, a second support layer disposed on one surface of the first support layer and covering the first distribution layer, a third distribution layer disposed on the second support layer, a second via layer passing through the second support layer and electrically connecting the first distribution layer to the third distribution layer, a third support layer disposed on the other surface of the first support layer and covering the second distribution layer, a fourth distribution layer disposed on the third support layer, and a third via layer passing through the third support layer and electrically connecting the second distribution layer to the fourth distribution layer, and the third distribution layer is the distribution layer.

12. The fan-out fingerprint sensor package of claim 11, wherein the first support layer has a greater thickness than those of the second support layer and the third support layer.

13. The fan-out fingerprint sensor package of claim 11, further comprising:
a backside redistribution layer disposed on the encapsulant;
a backside via passing through at least a portion of the encapsulant, and electrically connecting the fourth distribution layer to the backside redistribution layer;
a passivation layer disposed on the encapsulant, and having an opening exposing at least a portion of the backside redistribution layer; and
an electrical connection structure disposed on the opening of the passivation layer, and electrically connected to the backside redistribution layer, having been exposed.

14. A fan-out fingerprint sensor package comprising:
a first connection member having a through-hole;
a fingerprint sensor disposed in the through-hole of the first connection member, and having an active surface on which a connection pad and a sensing pattern are disposed and an inactive surface opposing the active surface;
an encapsulant encapsulating at least portions of the first connection member and the fingerprint sensor; and a second connection member disposed on the first connection member and the active surface of the fingerprint sensor, wherein the first connection member includes a distribution layer, the second connection member includes a first insulating layer disposed on the distribution layer of the first connection member and the active surface of the fingerprint sensor, a redistribution layer disposed on the first insulating layer, a first via connecting the redistribution layer to the connection pad of the fingerprint sensor, and a second via connecting the redistribution layer to the distribution layer of the first connection member, the first via passes through the first insulating layer and at least a portion of the encapsulant, the second via passes through the first insulating layer, the first connection member includes a first support layer, a first distribution layer in contact with the first insulating layer and embedded in one surface of the first support layer, a second distribution layer disposed on the other surface of the first support layer opposing one surface in which the first distribution layer is embedded, a first via layer passing through the first support layer and electrically connecting the first distribution layer to the second distribution layer, a second support layer disposed on the first support layer and covering the second distribution layer, a third distribution layer disposed on the second support layer, and a second via layer passing through the second support layer and electrically connecting the second distribution layer to the third distribution layer, and the first distribution layer is the distribution layer.

15. The fan-out fingerprint sensor package of claim 14, wherein one surface of the first support layer being in contact with the first insulating layer, and one surface of the first distribution layer being in contact with the first insulating layer have a step.

16. The fan-out fingerprint sensor package of claim 14, further comprising:

a backside redistribution layer disposed on the encapsulant;

a backside via passing through at least a portion of the encapsulant, and electrically connecting the third distribution layer to the backside redistribution layer;

a passivation layer disposed on the encapsulant, and having an opening exposing at least a portion of the backside redistribution layer; and an electrical connection structure disposed on the opening of the passivation layer, and electrically connected to the backside redistribution layer, having been exposed.

* * * * *